(12) United States Patent
Kato et al.

(10) Patent No.: US 8,031,888 B2
(45) Date of Patent: *Oct. 4, 2011

(54) ELECTRONIC APPARATUS HAVING AUDIO OUTPUT UNITS

(75) Inventors: Takenori Kato, Kyoto (JP); Akio Ogura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1195 days.

This patent is subject to a terminal disclaimer.

(21) Appl. No.: 11/668,340

(22) Filed: Jan. 29, 2007

(65) Prior Publication Data

US 2007/0127743 A1 Jun. 7, 2007

Related U.S. Application Data

(62) Division of application No. 10/447,182, filed on May 29, 2003, now Pat. No. 7,184,561.

(30) Foreign Application Priority Data

Jun. 4, 2002 (JP) .................................. 2002-162493

(51) Int. Cl.
H03F 99/00 (2009.01)

(52) U.S. Cl. .......................... 381/120; 330/257; 381/111

(58) Field of Classification Search .................. 381/120, 381/111, 116, 117, 121, 123; 330/257, 281, 330/288, 141, 86, 262, 263, 295, 124, 126 R See application file for complete search history.

(56) References Cited

U.S. PATENT DOCUMENTS

| 5,420,535 | A  | * | 5/1995  | Nebuloni et al. ................ 330/51  |
| 5,642,074 | A  | * | 6/1997  | Ghaffaripour et al. .......... 330/51  |
| 5,682,121 | A  | * | 10/1997 | Naokawa et al. .............. 330/252 |
| 5,796,303 | A  | * | 8/1998  | Vinn et al. ...................... 330/51  |
| 6,154,094 | A  | * | 11/2000 | Seven ........................... 330/252 |
| 6,239,655 | B1 | * | 5/2001  | Orozov et al. .................. 330/86  |
| 7,184,561 | B2 | * | 2/2007  | Kato et al. ..................... 381/120 |

* cited by examiner

*Primary Examiner* — Xu Mei
*Assistant Examiner* — Lun-See Lao
(74) *Attorney, Agent, or Firm* — DLA Piper LLP (US)

(57) ABSTRACT

Two control voltages are generated, one increasing and another decreasing, in response to the rise of the voltage of a condenser of a common time-constant circuit. Based on the two control voltages, a first and a second currents are formed, from which four different combinations of currents are established. By feeding one of four combinations to each of multiple differential output amplifier circuits each having a feedback resistor, the multiple output amplifier circuits can be individually started up or shut down without generating popcorn noise, using only one single time constant circuit.

10 Claims, 6 Drawing Sheets

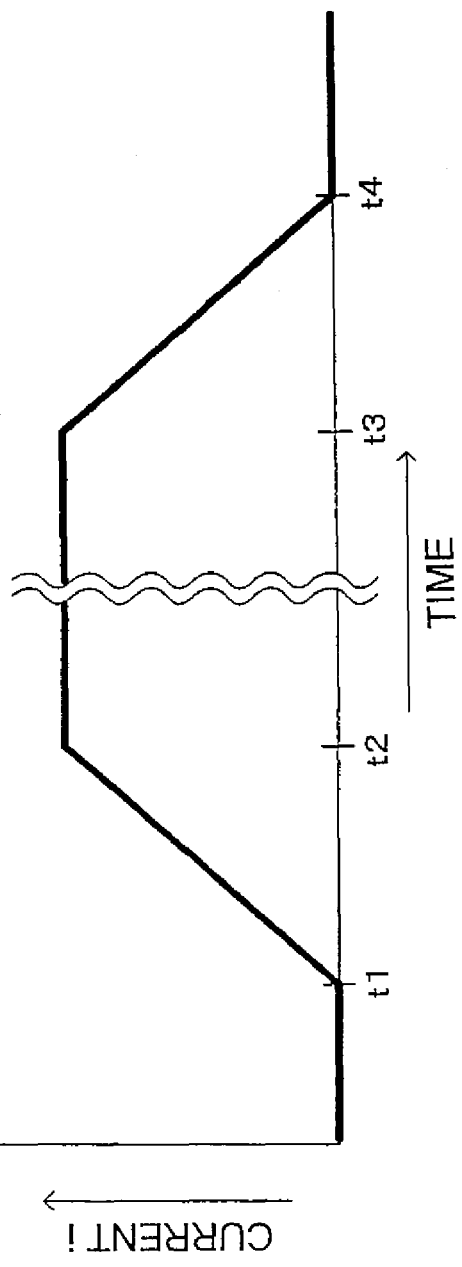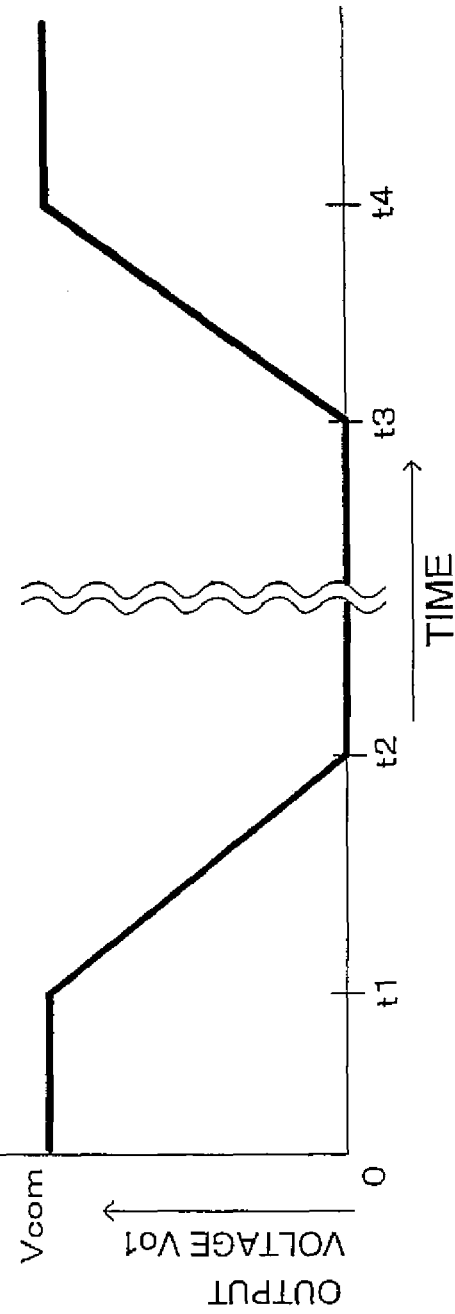
FIG. 3(a)
FIG. 3(b)

FIG. 6

| STATE TRANSITION | A→B | A→D | B→A | B→C | C→B | C→D | D→A | D→C |
|---|---|---|---|---|---|---|---|---|
| dir | LOW | LOW | HIGH | HIGH | LOW | LOW | HIGH | HIGH |
| ct−1f | LOW | LOW | LOW | HIGH | HIGH | HIGH | LOW | HIGH |
| ct−1r | LOW | HIGH | LOW | LOW | LOW | HIGH | HIGH | HIGH |

ELECTRONIC APPARATUS HAVING AUDIO OUTPUT UNITS

CROSS-REFERENCE TO THE RELATED APPLICATIONS

This is a divisional of application Ser. No. 10/447,182 filed May 29, 2003, the entire contents of which are incorporated by reference. This application also claims benefit of priority under 35 U.S.C. §119 to Japanese Patent Application No. 2002-162493 filed Jun. 4, 2002, the entire contents of which are incorporated by reference.

FIELD OF THE INVENTION

This invention relates to an electronic apparatus having a multiplicity of audio output units for outputting sounds with reduced popcorn noise during a startup and a shutdown of the audio output unit.

BACKGROUND OF THE INVENTION

It is often the case that electronic apparatuses having audio output units generate unpleasant audible popcorn noise due to a sudden change of a bias voltage during a startup and a shutdown of the audio output unit. In order to prevent or suppress generation of such popcorn noise, the audio output unit is designed to have a sufficiently large time constant to allow the bias voltage rise and fall slowly during its startup and shutdown, respectively.

When the apparatus has a multiplicity of output amplifier circuits for a CD player and a MD player for example which are started up or shut down simultaneously, their bias voltages can be raised and dropped simultaneously using a common time constant circuit.

However, if the electronic apparatus has audio output units adapted to individually and independently start up or shut down a multiplicity of output amplifier circuits, the output amplifier circuits cannot be controlled by a single time constant circuit. In this case, each output amplifier circuit requires its own time constant circuit.

Take a cellular phone for example. It has four output amplifier circuits for an earphone, a back loudspeaker, a receiver, and an external output. Since cellular phones are powered by a battery, their power consumption is preferably reduced as much as possible to prolong the life of the battery. In a cellular phone, therefore, the output amplifier circuits are designed to operate in such a way that only one output amplifier circuit currently in use is powered but the rest of the output amplifier circuits are shut down. Thus, a multiplicity of time constant circuits are provided one for each output amplifier circuit to allow the individual output amplifier circuits to be started up and shut down without generating popcorn noise.

These time constant circuits respectively require a condenser and a charge and discharge circuit. These output amplifier circuits occupy a large area on an IC chip, since each of the output amplifier circuits includes a condenser. This hinders miniaturization of the IC chip. If these condensers are externally provided, the IC chip requires additional connection pins. In addition, a space is needed for installing the condensers.

SUMMARY OF THE INVENTION

It is, therefore, an object of the invention is to provide an electronic apparatus having a multiplicity of audio output units capable of independently starting up and shutting down a multiplicity of output amplifier circuits, without generating popcorn noise, using a single time constant circuit.

In accordance with one aspect of the invention, there is provided an electronic apparatus having audio output units, comprising:
a multiplicity of output amplifier circuits each having
a differential amplifier having a first input terminal for receiving an audio input signal, a second input terminal for receiving a reference voltage, and an output terminal for outputting the output signal generated by said amplifier circuit, and
a feedback resistor connected between said first input terminal and said output terminal, said first input terminal capable of receiving an externally supplied DC current;
a common time constant circuit having a condenser and a charge and discharge circuit connected to said condenser, said time-constant circuit receiving a direction instruction signal instructing charging or discharging of said condenser, and charging said condenser to a first predetermined voltage (the voltage across said condenser hereinafter referred to as charging voltage) with a predetermined time constant upon receipt of a direction instruction signal instructing charging of said condenser, but discharging said condenser to a second charging voltage with said predetermined time constant upon receipt of a direction instruction signal instructing discharging of said condenser, said time constant circuit thereby outputting said charging voltage of said condenser;
a common current instruction circuit receiving said charging voltage, said common current instruction circuit outputting a first voltage that increases (decreases) when said charging voltage increases (decreases) (said first voltage referred to as first direction voltage) and a second voltage that decreases (increases) when said charging voltage increases (decreases) (said second voltage referred to as second direction voltage); and
a multiplicity of current control circuits, each connected to a corresponding one of said output amplifier circuits and each
receiving said first direction voltage, second direction voltage, a first direction current selection signal, and a second direction current selection signal, and
selectively outputting either one of a first direction current to said corresponding output amplifier circuit in accord with said first direction voltage, a second direction current in accord with said second directional voltage, a sum of said first and second direction currents, or zero current according to the combination of said first and second direction current selection signals.

In the inventive electronic apparatus having audio output units, if the current state of the output amplifier circuit is to be changed, either one of the first and second direction selection switches is selected based on the current state of the output amplifier circuit (i.e. state of the output amplifier circuit being shut down or in operation) and the current state of the charged condenser. Under this condition, the state of the time constant circuit is slowly inverted. Thus, any one or more of the multiple output amplifier circuits can be individually started up and shut down without generating popcorn noise, using a single time-constant circuit.

In the invention, a transistorized differential amplifier circuit is used as a common current instruction circuit such that the differential amplifier circuit is controlled by the charging voltage and the reference voltage. This enables, in an easy and accurate way, establishing the first direction voltage that increases with the charging voltage, and a second direction voltage that decreases with the charging voltage (implying that the second direction voltage decreases as the charging voltage increases).

Further, a first series circuitry of a first direction current control element and a first direction selection switch and a second series circuitry of a second direction current control element and a second direction selection switch are connected together in parallel such that the switching of the first and the second direction selection switches can be controlled. Thus, the currents determining the biases of the respective output amplifier circuits can be easily controlled individually and independently.

BRIEF DESCRIPTION OF THE DRAWINGS

FIGS. 3 (a)-(b) are graphical representations of a current i and an output voltage Vo1 during a startup and after a shutdown of the output amplifier circuit.

FIG. 6 shows control conditions for state transitions.

DETAILED DESCRIPTION OF THE PREFERRED EMBODIMENT

The invention will now be described in detail by way of example with reference to the accompanying drawings. In what follows the term "audio" means "sound" and "acoustic".

Figure 1:
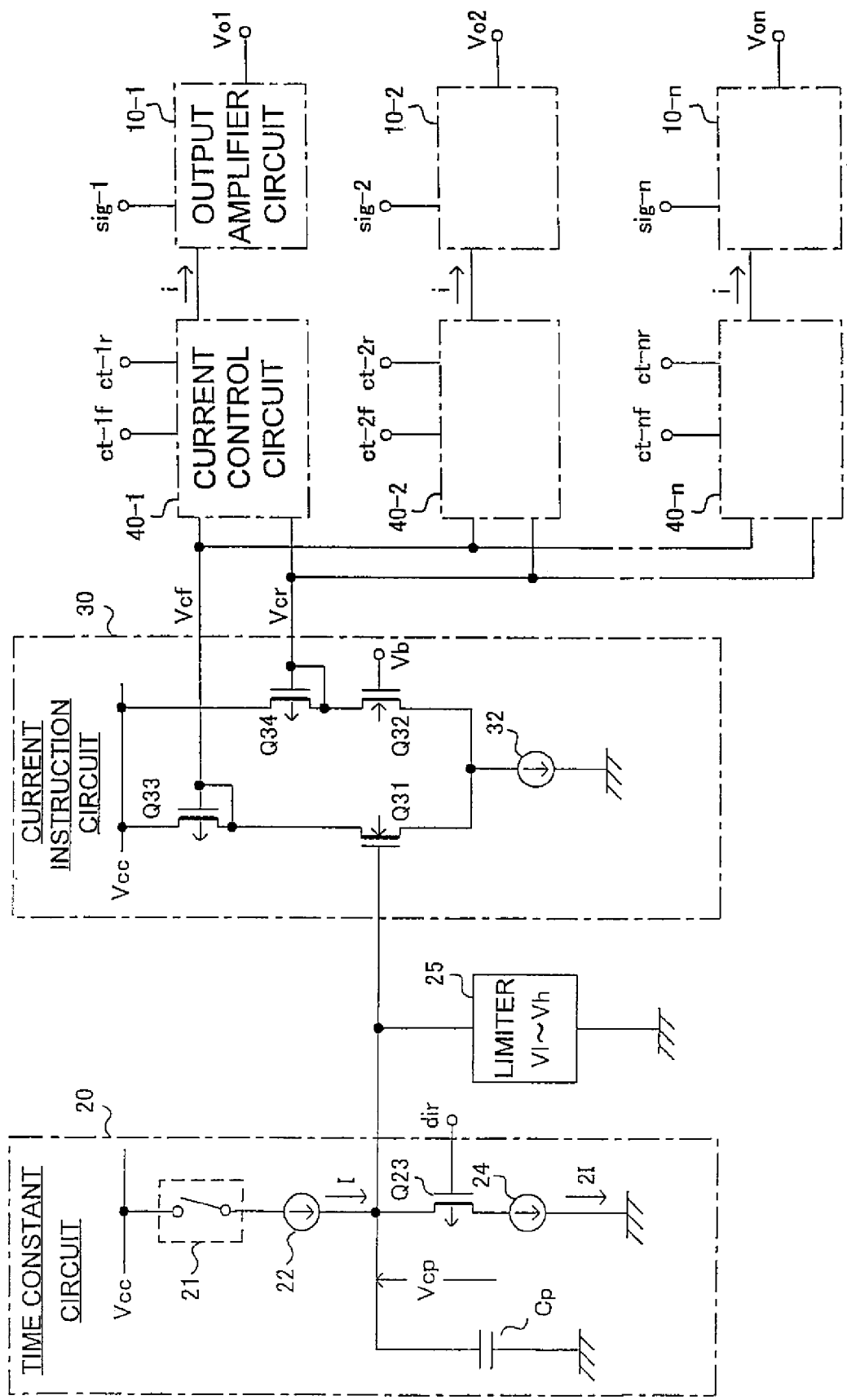
FIG. 1 shows an overall structure of audio output units of an electronic apparatus according to the invention.
Figure 2:
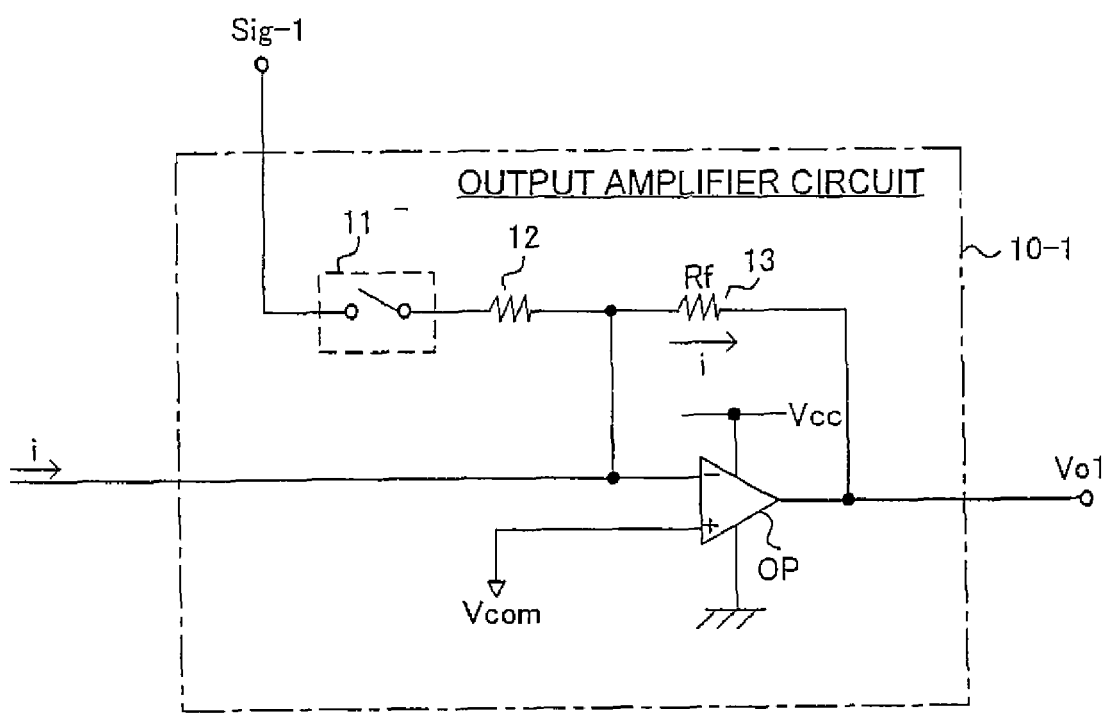
FIG. 2 shows an output amplifier circuit according to the invention.
Figure 4:
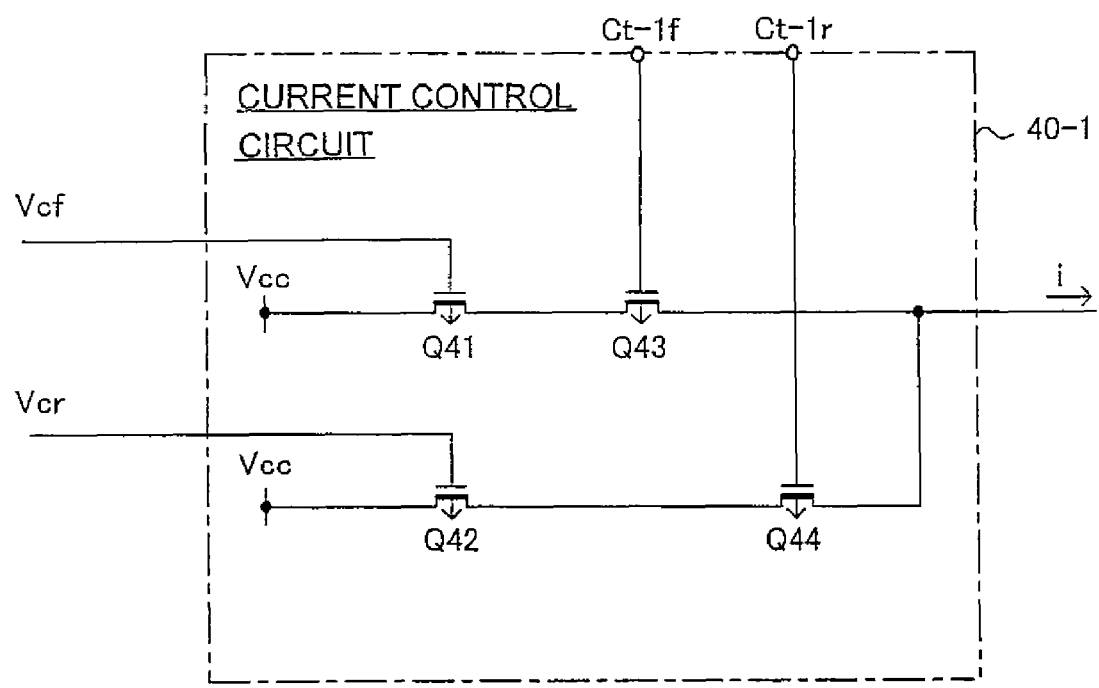
FIG. 4 is a circuit diagram of a current control circuit according to the invention.

FIG. 1 shows an overall structure of audio output units of an electronic apparatus embodying the invention. FIG. 2 shows a structure of an output amplifier circuit shown in FIG. 1. FIG. 3 are graphs illustrating operations of the output amplifier circuit during a startup and a shutdown of the circuit. FIG. 4 shows a structure of a current control circuit shown in FIG. 1.

The audio output unit of FIG. 1 has a multiplicity of output amplifier circuits 10-1-10-$n$ for respectively amplifying audio input signals sig-1-sig-n received to generate output signals Vo1-Von. Each of these output amplifier circuits 10-1-10-$n$ is operable at a predetermined bias voltage. In what follows the term "voltage" refers to the potential with respect to the ground, unless otherwise stated.

The present invention enables a multiplicity of output amplifier circuits 10-1-10-$n$ to be started up and shut down individually and independently without generating a popcorn noise. To do so, the invention provides a common time constant circuit 20, a common limiter circuit 25, a common current instruction circuit 30, and current control circuits 40-1-40-$n$ one for each of the output amplifier circuits 10-1-10-$n$, all connected for a cooperative operation.

These components may be formed on one IC chip, or on multiple IC chips with their components grouped on the respective IC chips.

FIG. 2 shows the structure of the output amplifier circuit 10-1. Other output amplifier circuits 10-2-10-$n$ also have the same structure. As shown in FIG. 2, an operational amplifier OP of the circuit 10-1 is supplied at the non-inverting input terminal (+) thereof with a reference voltage Vcom, and supplied at the inverting input terminal (−) thereof with an audio input signal sig-1 via a switch 11 and an input resistor 12. The switch 11 is turned on while amplifying and outputting the audio input signal sig-1. A feedback resistor 13 of resistance Rf is connected between the inverting input terminal (−) and the output terminal of the operational amplifier OP.

The inverting input terminal (−) of the operational amplifier OP is supplied with a current i from a current control circuit 40-1. The current i flows into the output terminal of the operational amplifier OP via the feedback resistor 13.

The operational amplifier OP is adapted to equalize the voltage applied to the inverting input terminal (−) with the reference voltage Vcom applied to non-inverting input terminal (+). Therefore, the output voltage (or bias voltage) Vo1 of the operational amplifier OP equals the reference voltage Vcom minus the voltage drop across the feedback resistor 13, i.e. Vo1=Vcom−i×Rf. In actuality, the output voltage Vo1 is the amplified audio input signal sig-1 superimposed with a DC voltage. However, the AC component of the output signal, i.e. audio signal, will not be mentioned in the description below.

Referring to FIG. 3, operations of the output amplifier circuit 10-1 at the time of a startup and a shut down will now be described. FIG. 3 (a) shows the change of current i, and FIG. 3 (b) shows the change of the output voltage Vo1.

The output amplifier circuit 10-1 is biased by a predetermined output voltage (which is the reference voltage Vcom in the example shown herein) when it is performing amplification, up to time t1 in FIG. 3 (a). Therefore, the current i is zero up to time t1.

As the output amplifier circuit 10-1 is stopped, the current i begins to gradually increase from zero at time t1, as shown in FIG. 3 (a), so as to gradually decrease the output voltage Vo1. The output voltage Vo1 becomes zero when the product i×Rf of the current i and the feedback resistance Rf equals the reference voltage Vcom at time t2. At this moment, the current i equals the predetermined level (Vcom/Rf).

The power supply voltage Vcc, supplied to the output amplifier circuit 10-1 and the current control circuit 40-1 which is the current source supplying the current i, is shut down while the output voltage Vo1 is zero. As a consequence, no popcorn noise will be generated accompanying the shutdown of the power supply voltage Vcc.

To start up the output amplifier circuit 10-1 at time t3 say, the source voltage Vcc is turned on, to thereby supply power to the output amplifier circuit 10-1 and the current control circuit 40-1. This causes the current i (=Vcom/Rf) to flow. Since the output voltage Vo1 is zero at the time the source voltage Vcc is supplied, no popcorn noise will be generated then, either.

The current i is then gradually decreased from the predetermined level (=Vcom/Rf), starting at time t3, as shown in FIGS. 3 (a)-(b). This causes the output voltage Vo1 to gradually increase. The output voltage Vo1 reaches the reference voltage Vcom when the current i becomes zero at time t4. This completes the startup of the output amplifier circuit 10-1, rendering the output circuit 10-1 operable under normal condition. Under this condition, the switch 11 is turned on to amplify the input audio signal sig-1 which is then outputted. During the amplifying operation, the current i is maintained at zero.

In this way, the current i is gradually increased when the output amplifier circuit 10-1 is stopped, and the current i is gradually decreased when the output amplifier circuit 10-1 is started up. It is seen that the power to the output amplifier circuit 10-1 is turned on and off while the output voltage Vo1 remains zero. This prevents generation of popcorn noise during a startup and a shutdown.

Referring again to FIG. 1, the time constant circuit 20 includes a switch 21, a constant current sources 22 supplying a constant current I, and a charge and discharge condenser Cp connected in series between the power supply voltage Vcc and the ground. Connected in parallel with the condenser Cp is a p-type MOS transistor (referred to as p-type transistor) Q23 connected in series with a constant, current source 24 supplying a constant current 2I. The p-type transistor Q23 is turned on and off by a direction control signal dir. The switch 21 is always turned on while the audio output unit is in operation.

In the time constant circuit 20, when the direction control signal dir is at a high level HIGH and the p-type transistor Q23 is turned off, the condenser Cp is charged by the constant current I. Therefore, its charging voltage Vcp increases linearly. Conversely, when the direction control signal dir is at a low level LOW and the p-type transistor Q23 is turned on, the condenser Cp discharges a constant current I (=2I−I). Therefore, its charging voltage Vcp decreases linearly. The condenser Cp may be provided as an external component, not included in the IC chip.

The limiter circuit 25 limits the upper and the lower limits of the charging voltage Vcp to a predetermined upper level Vh and a predetermined lower level Vl, respectively. The upper and lower limits Vh and Vl, respectively, are set in accordance with the dynamic range of the current instruction circuit 30 in the next stage. This limiter circuit 25 may be included in the time constant circuit 20.

In the example shown herein, the current instruction circuit 30 is constructed in the form of a current difference circuit. The current instruction circuit 30 has an n-type MOS transistor (hereinafter referred to as n-type transistor) Q31 adapted to receive at the gate thereof the charging voltage Vcp as a control signal, and an n-type transistor Q32 adapted to receive at the gate thereof a predetermined reference voltage Vb. The sources of the n-type transistors Q31 and Q32 are connected together and further connected to the constant current source 32 adapted to flow a predetermined current.

Thus, these n-type transistors Q31 and Q32 forms paired differential transistors, with the reference voltage Vb, coupled to the gate of the transistor Q32, is set to an intermediate voltage between the upper limit Vh and the lower limit Vl of charging voltage Vcp.

The drain of the n-type transistor Q31 is connected to the source voltage Vcc via a p-type transistor Q33 whose gate and drain are coupled together. The drain of the n-type transistor Q32 is connected to the source voltage Vcc via a p-type transistor Q34 whose gate and drain are coupled together. It is noted that each of these p-type transistors Q33 and Q34 can be substituted for by a respective load resistor.

The current instruction circuit 30 outputs, from the drain of the n-type transistor Q31, a voltage Vcf that decreases with the charging voltage Vcp (the decreasing voltage referred to as the second direction voltage or positive current instruction signal). On the other hand, a voltage Ver that increases with the charging voltage Vcp (said voltage referred to as the first direction voltage or reverse current instruction signal) is outputted from the drain of the n-type transistor Q32.

The current control circuits 40-1-40-n are provided one for each of the output amplifier circuits 10-1-10-n. The current control circuits 40-1-40-n are supplied with a common positive current instruction signal Vcf and a common reverse current instruction signal Vcr. The current control circuits 40-1-40-n are also individually supplied with respective positive current selection signals ct-1f-ct-nf and reverse current selection signals ct-1r-ct-nr.

Referring to FIG. 4, there is shown a current control circuit 40-1, other current control circuits 40-2-40-n have a structure similar to that of the circuit 40-1.

As shown in FIG. 4, the positive current instruction signal Vcf is applied to the gate of the p-type transistor Q41 serving as a positive current control element, while a positive current selection signal ct-1f is applied to the gate of a p-type transistor Q43 serving as a selection switch for selecting the direction of positive current (the switch referred to as positive-direction selection switch). These transistors Q41 and Q43 are connected in series.

Conductivity of the p-type transistor Q41 is controlled by the positive current instruction signal Vcf. Hence, when the p-type transistor Q43 is turned on, a current flows through this first series circuit in accord with the instruction signal Vcf.

The reverse current instruction signal Vcr is applied to the gate of a p-type transistor Q42 serving as an element for controlling reverse current (the element referred to as reverse current controlling element), while the reverse current selection signal ct-1r is applied to the gate of a p-type transistor Q44 serving as a switch for selecting the reverse direction of current (the switch referred to as reverse-direction selection switch). These transistors Q42 and Q44 are connected in series. The conductivity of the p-type transistor Q42 is controlled by the reverse current instruction signal Vcr. Thus, when the p-type transistor Q44 is turned on, a current flows through this second series circuit in accord with the instruction signal Vcr.

Since the first and the second series circuits are connected in parallel with each other, a combined current i is supplied to the output amplifier circuit 10-1 in the next stage.

Thus, a current i indicative of the magnitude of the positive current instruction signal Vcf, magnitude of the reverse current instruction signal Ver, and levels (LOW or HIGH) of the positive current selection signal ct-1f and reverse current selection signal ct-1r is selectively outputted from the current control circuit 40-1. The current i outputted selectively is associated with either:
the positive current instruction signal Vcf; the reverse current instruction signal Vcr; or the positive current instruction signal Vcf plus the reverse current instruction signal Vcr, or zero current.

Figure 5:
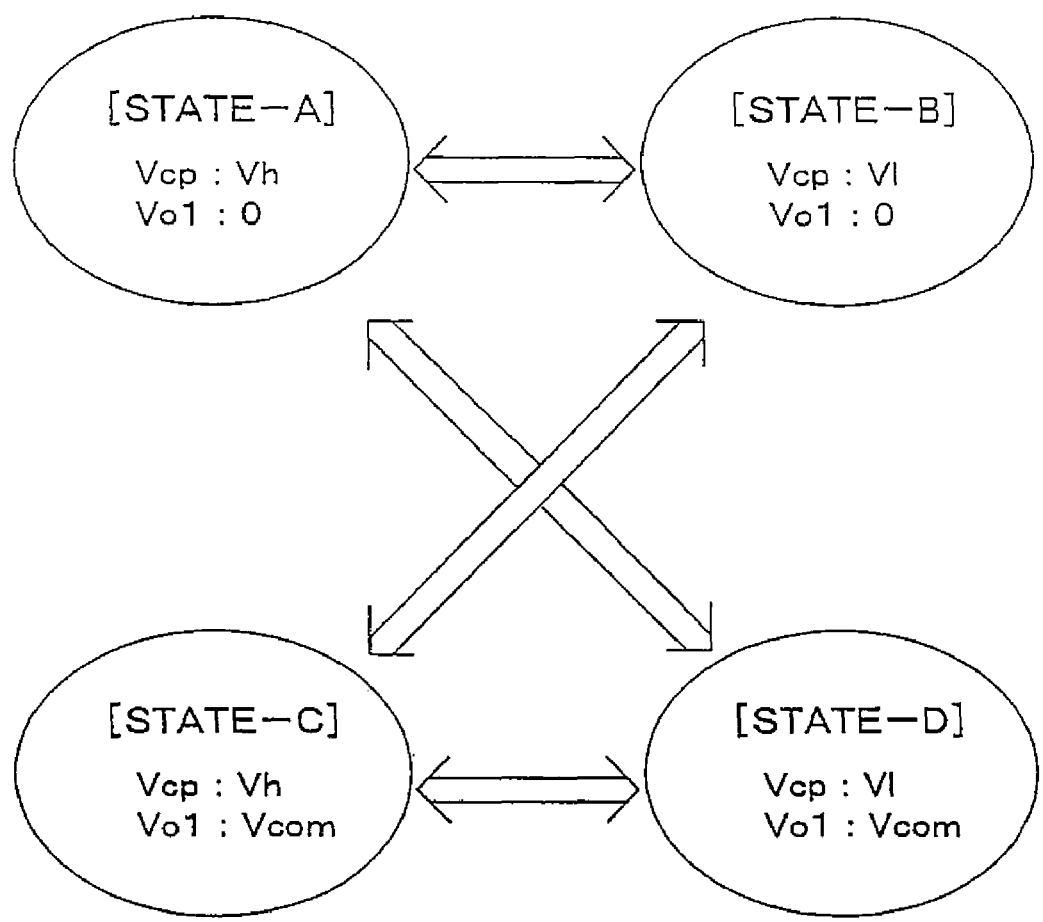
FIG. 5 illustrates state transitions of an audio output unit according to the invention.

Referring to FIG. 5, there is shown different types of state transitions involved in the audio output unit. FIG. 6 shows conditions governing the state transitions. Operations of the electronic apparatus of the invention will now be described below.

In this invention, the apparatus has a multiplicity of output amplifier circuits 10-1-10-n associated with the respective audio output units. Each of these output amplifier circuits can be operated (in operating state) or stopped (in inoperable state) arbitrarily, and can change its state from one to the other independently and individually. Moreover, any of the output amplifier circuits 10-1-10-n will not generate a popcorn noise as they change their states, as will be seen below.

Each of the output amplifier circuits 10-1-10-n has four possible states A-D as shown in FIG. 5. These states A-D taken by the respective output amplifier circuits 10-1-10-n are determined by the conditions of the time constant circuit 20 and the current control circuit 40-1-40-n.

In state A, the charging voltage Vcp is high (voltage Vh), and the output voltage Vo1 is zero (0). In state B, the charging voltage Vcp is low (voltage Vl), and the output voltage Vo1 is zero (0). In state C, the charging voltage Vcp is high Vh, and the output voltage Vo1 is Vcom (reference voltage). In state D, the charging voltage Vcp is low Vl, and the output voltage Vo1 is Vcom. That is, in states A and B, the output amplifier circuits 10-1-10-n are disabled, and in state C and D, the output amplifier circuits 10-1-10-n are in operation.

Bidirectional inter-state transitions are possible between state A and state B, state A and state D, state B and state C, and state C and state D.

FIG. 6 shows possible state transitions among the states A-D in terms of the direction control signal dir and the positive current selection signal ct-1f-ct-nf, or reverse current selection signal ct-1r-ct-nr in combination. It should be understood that FIG. 6 shows transitions occurring in the exemplary output amplifier circuit 10-1.

State transitions are shown by arrows in FIG. 6. For example, symbol "A→B" represents a state transition from state A to state B. Symbols "LOW" and "HIGH" for the signal dir represent the levels of the signal dir, rendering the p-type transistor Q23, controlling the direction of the transition, turned on or off, respectively. Symbols "LOW" and "HIGH" for the positive direction current selection signal ct-1f represent the levels of the signal ct-1f, rendering the positive-direction selection switch Q43 turned on or off, respectively. Similarly, symbols "LOW" and "HIGH" for the reverse current selection signal ct-1r represent the levels of the signal ct-1r, rendering the reverse-direction selection switch Q44 turned on or off. It will be understood that the logical operations of the positive-direction selection switch Q43 and reverse selection switch Q44 are inverted, since they are p-type transistors.

A preferred state of the audio output unit can be obtained by choosing an appropriate combination of the direction control signal dir and positive current selection signal ct-1f-ct-nf or reverse current selection signal ct-1r-ct-nr that corresponds to a state transition leading to the preferred state of the audio output unit, as shown in FIG. 6. In this way, arbitrary one or more than one of the output amplifier circuits can be independently and individually started up and shut down without affecting other output amplifier circuits without generating popcorn noise by the use of a single time constant circuit.

As an example, operations of the output amplifier circuit 10-1 will be described below. To begin with, a state transition from state A to state D is considered. Before the transition, the output amplifier circuit is in state A, where the charging voltage Vcp is high (Vh), the positive current instruction signal Vcf low, and the positive selection signal ct-1f low, so that the current i flowing through the output amplifier circuit 10-1 has a predetermined magnitude. Consequently, the output voltage Vo1 is zero. That is, the output amplifier circuit 10-1 is shut down.

Under this condition, the reverse selection signal ct-1r is pulled up to HIGH while keeping the positive selection signal ct-1f LOW, and the direction control signal dir is pulled down to LOW to turn on the p-type transistor Q23. This caused the charging voltage Vcp to be gradually lowered, and causes the positive current instruction signal Vcf to be gradually increased, thereby reducing the current i. As a consequence, the output voltage Vo1 is gradually increased, until it reaches the reference voltage Vcom when the current i becomes zero.

Next, a transition from state A to state B will be considered. This transition takes place when the charging voltage Vcp is lowered from the high charging voltage Vh to the constant voltage Vl to hold the output amplifier circuit 10-1 shut down but allow other output amplifier circuit to be started up or shut down.

In this case, while keeping both the positive selection signal ct-1f and the reverse selection signal ct-1r LOW as they are in state A prior to the transition, the direction control signal dir is pulled down to LOW to turn on the p-type transistor Q23. This causes the charging voltage Vcp to slowly decrease and causes the positive current instruction signal Vcf to rise slowly, thereby slowly lowering the reverse current instruction signal Vcr. As a result, the current i, which is the sum of the currents flowing through the two paths, invariably remains constant. Hence, the output voltage Vo1 invariably remains at zero volt.

In this way, the output amplifier circuit 10-1 remains shut down without being affected by the change of the charging voltage Vcp introduced to start up or shut down other output amplifier circuits.

Although details are omitted, it will be understood that a transition from state C (operating state) to state B (non-operating state) is possible, and so is a transition from state C to another operating state D. These transitions among states A-D are carried out when relevant transition conditions listed in the table of FIG. 6 are satisfied.

What we claim is:

1. An electronic apparatus having audio output units, comprising:
   a multiplicity of output amplifier circuits each having
      a differential amplifier having a first input terminal for receiving an audio input signal, a second input terminal for receiving a reference voltage, and an output terminal for outputting its output signal, and
      a feedback resistor connected between said first input terminal and said output terminal, said first input terminal capable of receiving a supplied DC current;
   a common time-constant circuit having a condenser and a charge and discharge circuit connected to said condenser, said time-constant circuit receiving a direction instruction signal instructing charging or discharging of said condenser, and charging said condenser to a first predetermined charging voltage with a predetermined time constant upon receipt of a direction instruction signal instructing charging of said condenser, but discharging said condenser to a second charging voltage with said predetermined time constant upon receipt of a direction instruction signal instructing discharging of said condenser, said time-constant circuit thereby outputting a charging voltage of said condenser;
   a common current instruction circuit receiving said charging voltage of said condenser, said common current instruction circuit outputting a first direction voltage that increases (decreases) as said charging voltage of said condenser increases (decreases) and a second direction voltage that decreases (increases) as said charging voltage of said condenser increases (decreases); and
   a multiplicity of current control circuits, each current control circuit connected to a corresponding one of said output amplifier circuits and
   receiving said first direction voltage, second direction voltage, a first direction current selection signal, and a second direction current selection signal, and
   selectively outputting, to said corresponding output amplifier circuit, either one of a first direction current in accord with said first direction voltage, a second direction current in accord with said second directional voltage, a sum of said first and second direction currents, or zero current according to the combination of said first and second direction current selection signals.

2. The electronic apparatus according to claim 1, wherein when any one of said output amplifier circuits is started up, power is supplied to said output amplifier circuit while the output voltage of the differential amplifier of said output amplifier circuit is zero, and when any one of said output amplifier circuits is shut down, the power to said output amplifier circuit is cut down while the output voltage of said differential amplifier is zero.

3. The electronic apparatus according to claim 1, wherein when any one of said output amplifier circuits is started up, power is supplied to said output amplifier circuit and the current control circuit associated with said output amplifier circuit while the output voltage of the differential amplifier of said output amplifier circuit is zero, and when any one of said output amplifier circuits is shut down, the power to said output amplifier circuit and current control circuit is cut down while the output voltage of the differential amplifier is zero.

4. The electronic apparatus according to claim 1, wherein said time-constant circuit has a voltage limiter circuit for limiting the upper and lower limits of said charging voltage of said condenser a respective predetermined upper and lower voltage.

5. The electronic apparatus according to claim 1, wherein said charge and discharge circuit includes a first constant current source for supplying a first constant current, a charge/discharge instruction switch adapted to be turned on and off by said direction instruction signal, and a second constant current source supplying a second constant current which is double said first constant current, all connected in series, said charge and discharge circuit outputting a charging voltage of said condenser from the node between said first and second constant current sources.

6. The electronic apparatus according to claim 5, wherein said current instruction circuit includes a differential amplifier circuit consisting of a pair of transistors, said differential amplifier circuit receiving said charging voltage of said condenser as a control signal for controlling one transistor, and a predetermined reference voltage as a control signal for controlling another transistor.

7. The electronic apparatus according to claim 6, wherein said differential amplifier circuit has a third constant current source connected to one end of said one transistor and to one end of said another transistor of said differential amplifier circuit, the other end of said one transistor and the other end of said another transistor are connected to respective load means, said one transistor outputting from said other end thereof said first direction voltage, and said other another transistor outputting from said other end thereof said second direction voltage.

8. The electronic apparatus according to claim 6, wherein said predetermined reference voltage is set between said first and said second charging voltages.

9. The electronic apparatus according to claim 1, wherein each of said multiplicity of current control circuits includes:
a first series circuitry consisting of a first direction selection switch adapted to be turned on by said first direction current selection signal and a first direction current control element for flowing a first direction current in accord with said first direction voltage, and
a second series circuitry consisting of a second direction selection switch adapted to be turned on by said second direction current selection signal and a second direction current control element for flowing a second direction current in accord with said second direction voltage, said first and second series circuitry connected in parallel to each other.

10. An electronic apparatus having audio output units, comprising:
a multiplicity of output amplifier circuits each having
a differential amplifier having a first input terminal for receiving an audio input signal, a second input terminal for receiving a reference voltage, and an output terminal for outputting the output signal of said amplifier circuit, and
a feedback resistor connected between said first input terminal and said output terminal, said first input terminal capable of receiving a supplied DC current;
a common time-constant circuit having a condenser and a charge and discharge circuit connected to said condenser, said time-constant circuit receiving a direction instruction signal instructing charging or discharging of said condenser, and charging said condenser to a first predetermined charging voltage with a predetermined time constant upon receipt of a direction instruction signal instructing charging of said condenser, but discharging said condenser to a second charging voltage with said predetermined time constant upon receipt of a direction instruction signal instructing discharging of said condenser, said time-constant circuit thereby outputting a charging voltage of said condenser;
a common current instruction circuit receiving said charging voltage of said condenser, said common current instruction circuit outputting a first direction voltage that increases (decreases) as said charging voltage of said condenser increases (decreases) and a second direction voltage that decreases (increases) as said charging voltage increases of said condenser (decreases); and
a multiplicity of current control circuits, each current control circuit connected to a corresponding one of said output amplifier circuits and each
receiving said first direction voltage, second direction voltage, a first direction current selection signal, and a second direction current selection signal, and
selectively outputting, to said corresponding output amplifier circuit, either one of a first direction current in accord with said first direction voltage, a second direction current in accord with said second directional voltage, a sum of said first and second direction current, or zero current according to the combination of said first direction current selection signal and second direction current selection signal, wherein
when any one of said multiplicity of output amplifier circuits in operation is shut down, the charging voltage of said time-constant circuit is reversed and the DC current supplied from the corresponding current control circuit is increased;
when any one of said multiplicity of output amplifier circuits not in operation is started up, the charging voltage of said time-constant circuit is reversed and the DC current supplied from the corresponding current control circuit is decreased; and
when the state(s) of only one or some of said multiplicity of output amplifier circuits are to be changed individually from non-operating state to operating state or vise versa, DC currents supplied from those current control circuits associated with the remaining output amplifier circuits to said remaining output amplifier circuits are controlled not to change through said change of states, irrespective of any change in the charging voltage of said condenser of said time-constant circuit.

* * * * *